United States Patent
Uzunov et al.

(10) Patent No.: US 8,686,788 B2
(45) Date of Patent: Apr. 1, 2014

(54) FILTER CIRCUIT

(75) Inventors: Ivan Stefanov Uzunov, Sofia (BG);
Peter Borissov Statev, Sofia (BG);
Buen Dimov Boyanov, Sofia (BG);
Rumen Mihajlov Bradvarov, Sofia (BG)

(73) Assignee: Smartcom Bulgaria AD, Sofia (BG)

( * ) Notice: Subject to any disclaimer, the term of this patent is extended or adjusted under 35 U.S.C. 154(b) by 0 days.

(21) Appl. No.: 13/387,117

(22) PCT Filed: Jun. 26, 2009

(86) PCT No.: PCT/IB2009/006083
§ 371 (c)(1),
(2), (4) Date: Mar. 13, 2012

(87) PCT Pub. No.: WO2010/150037
PCT Pub. Date: Dec. 29, 2010

(65) Prior Publication Data
US 2012/0161862 A1    Jun. 28, 2012

(51) Int. Cl.
*H03K 5/00* (2006.01)

(52) U.S. Cl.
USPC .................................. 327/557; 327/552

(58) Field of Classification Search
USPC ................................. 327/551–559
See application file for complete search history.

(56) References Cited

U.S. PATENT DOCUMENTS

| | | |
|---|---|---|
| 3,566,314 A | 2/1971 | Bies |
| 5,777,527 A | 7/1998 | Sanders |
| 6,844,792 B1 | 1/2005 | Koeppe et al. |
| 7,683,736 B2 * | 3/2010 | Inoue et al. ............... 333/133 |
| 7,808,310 B2 * | 10/2010 | Uzunov et al. ............ 327/557 |
| 2009/0134954 A1 | 5/2009 | Uzunov et al. |

* cited by examiner

*Primary Examiner* — Dinh T. Le (74) *Attorney, Agent, or Firm* — Ladas & Parry LLP (57) ABSTRACT

A circuit and method for filtering a signal. An amplifier receives an input signal and generates a differential output signal. A first resonator having series and parallel resonant frequencies is connected to the positive output port of the amplifier. A second resonator having series and parallel resonant frequencies is connected to the negative output port of the amplifier. The first and second resonators are coupled at a connection point. A buffering device receives the combined outputs of the resonators and outputs a filtered signal. The filtering method receives signals and passes them through the elements of the filter circuit to generate a filtered output signal.

42 Claims, 9 Drawing Sheets

FILTER CIRCUIT

CROSS-REFERENCE TO RELATED APPLICATION

This application claims the benefit of the U.S. national phase of PCT Application No. PCT/IB09/06083 filed on Jun. 26, 2009, the entirety of which is incorporated herein by reference.

FIELD OF THE INVENTION

This invention concerns a filter circuit for processing analog signals, and more specifically an active electronic filter combining buffering devices with resonators.

BACKGROUND OF THE INVENTION

Commonly, high-selectivity intermediate frequency (IF) filters in radio frequencies have been realized as surface-acoustic wave (SAW) filters or as ceramic filters. In both these filters, the electric signal is converted to a mechanical wave that propagates in some mechanical resonator. When the mechanical resonance frequency is the same as the frequency of the electrical signal, the signal is amplified; otherwise, it is suppressed. The filter transfer characteristics are defined by the mechanical parameters of the resonator: its size, material, the mode of the mechanical wave in the resonator, etc. In SAW filters, the waves travel on the surface of some piezoelectric material like Lithium Niobate ($LiNbO_3$), while in ceramic filters, piezoceramic is used as the resonator. Both types of filters have a stable frequency response with sharp cut-offs and narrow passbands, but both suffer from some disadvantages. Tolerances in mechanical construction, variations in dielectric permittivity, and real world manufacturing limitations often require adjustment of filter characteristics and operational tuning of filters to conform to stringent application performance requirements.

In some applications, SAW filters have been replaced by Film Bulk Acoustic Resonator (FBAR) filters. Similar to SAW filters, FBAR filters also employ mechanical resonance to achieve stable narrowband frequency response with sharp cut-offs. The mechanical resonator is a thin film layer, and the mechanical wave propagates in the bulk of the layer. Filters based on FBARs have several advantages over SAW and ceramic filters, including better temperature stability, smaller size, compatibility with existing silicon technology, higher operating frequency range, ability to handle higher power, better electrostatic discharge sensitivity, and higher quality factor (Q-factor).

An FBAR exhibits two resonance values: one series, $f_s$ and one parallel, $f_p$. Behavior of an FBAR resonator across a range of frequencies is illustrated in FIG. 1c, which shows the reactance of the resonator vs. frequency. At the series resonant frequency, the reactance is 0; the resonator acts like a short circuit; and a signal passes freely through the resonator. At the parallel resonant frequency, the reactance goes to infinity; the resonator acts like an open circuit; and a signal is blocked by the resonator. As may be seen by analysis of the modified Butterworth-Van Dyke (MBVD) equivalent circuit, the resistances in the MBVD equivalent circuit are very small compared with the impedance of the other circuit elements, and they are often neglected in theoretical analyses. The relative distance between series and parallel resonance frequencies $f_s$ and $f_p$ is about 2-3% and the Q-factor of an FBAR varies between 300 and 2500.

Two basic structures are commonly used for creating FBAR filters: ladder and lattice. In a ladder filter structure, a number of resonators are connected in series, with a shunt resonator connected to ground between each two adjacent series resonators. The central passband frequency of the ladder FBAR filter is defined by the series resonance frequency $f_{s,series}$ of the series resonators and the parallel resonance frequency $f_{p,shunt}$ of the shunt resonators, which are all equal. Thus, the series resonators are equivalent to short circuits at this frequency, connecting the filter input directly with the filter output. The shunt resonators are equivalent to open circuits at the same frequency and have no effect. The gain of the circuit is equal to one, which is the maximum gain of the filter. The gain in a small vicinity around this frequency is close to 1, which forms the filter passband.

Ladder FBAR filters present several disadvantages. First, they require many resonators in order to achieve reasonable attenuation in the stopband. In addition, constraints on the parameters of the resonators often necessitate adding additional elements such as inductors and capacitors in order to properly adjust the resonance frequencies of each FBAR in the filter. A third disadvantage is that adjustment of the filter characteristics with capacitors and inductors is often inconvenient and complicated. Finally, ladder filters do not allow significant extension of the filter passband bandwidth. The passband bandwidth is limited by the series resonance of the shunt FBARs and by the parallel resonance of the series FBARs.

Figure 1A:
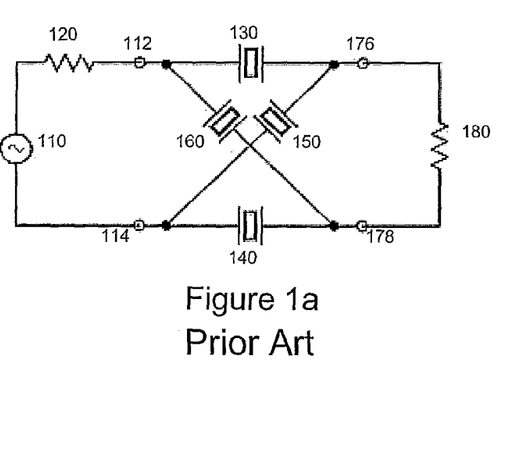
FIG. 1a is a circuit diagram of a prior art lattice filter based on piezoelectric resonators.
Figure 1B:
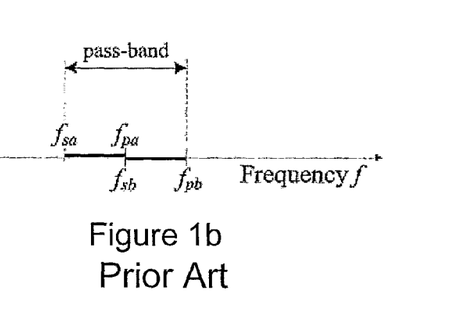
Figure 1C:
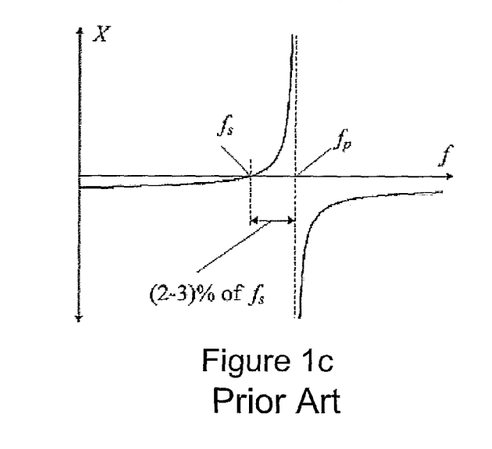
FIG. 1c is a graphical representation of the reactance vs. frequency in a prior art FBAR resonator.

A lattice filter circuit using resonators is shown in FIG. 1a. A lattice filter circuit, or bridge circuit, employs two different pairs of identical resonators. The parallel resonance frequency of one pair of resonators, 130 and 140, must equal the series resonance frequency of the other pair of resonators, 150 and 160. When this condition is satisfied, the passband theoretically extends from the series resonance frequency of the 130-140 pair to the parallel resonance frequency of the 150-160 pair. (In practice, the passband in the real circuit is slightly narrower within that range.) The transfer function of the lattice filter is given by the formula:

$$H = \frac{R(Z_b - Z_a)}{(R + Z_a)(R + Z_b)} \tag{1}$$

where $Z_a$ is the complex impedance of each of the resonator pair 130-140 in FIG. 1a;

$Z_b$ is the complex impedance of each of the resonator pair 150-160 in FIG. 1a;

R is the resistance value of two identical resistors, 120 and 180, connected in the circuit in FIG. 1a.

The attenuation of the filter is given by the formula $a=-20\log_{10}|H|$ (in dB).

Figure 2A:
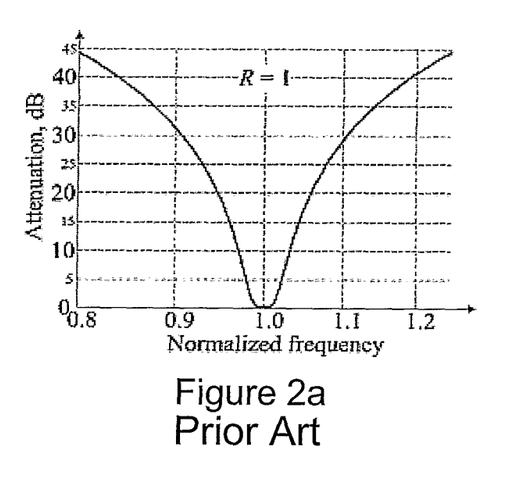
Figures 2B, 2C:
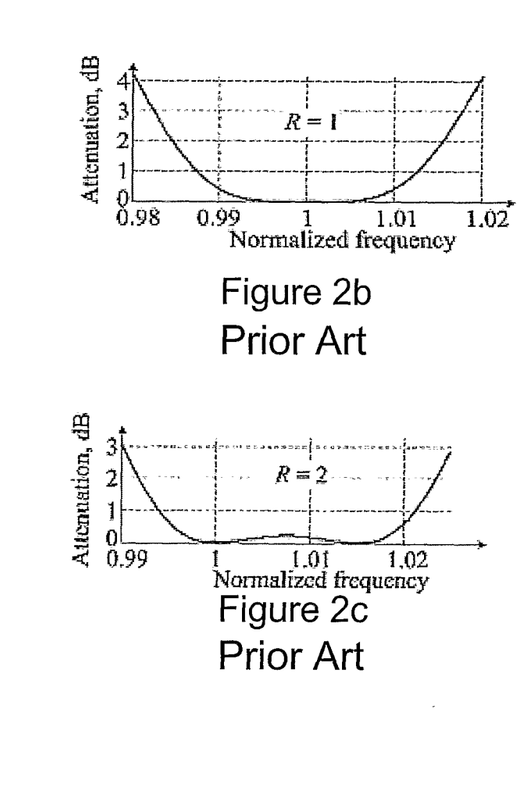
FIG. 2b is a graphical representation of the passband frequency plot of attenuation vs. frequency in a prior art FBAR lattice filter.
FIG. 2c is a graphical representation of the passband frequency plot of attenuation vs. frequency in a prior art FBAR lattice.

The suppression of the signal in the stopband is much greater in the lattice circuit than in a single or double stage ladder circuit. FIG. 2a is a graphical representation of the attenuation of a signal in a lattice filter as a function of signal frequency. FIG. 2b is a more detailed representation of attenuation vs. frequency within the passband. As can be seen in the graphs, signal attenuation of the lattice filter increases monotonically in the stopband. In the ladder filter, in contrast, signal attenuation peaks at the edge of the passband and then returns rapidly to very low values.

The lattice filter shown in FIG. 1a has two frequencies of minimum attenuation, one at the frequency $f_0=f_{pa}=f_{sb}$, and the other at the frequency that satisfies the condition R=

$\sqrt{Z_a Z_b}$, where R is the resistance of the filter circuit. At the frequency $f_0$, resonators 130 and 140 are in parallel resonance, and resonators 150 and 160 are in series resonance. Thus, resonators 130 and 140 act as open circuits, and resonators 150 and 160 act as short circuits, and the filter input is directly connected to the filter output, producing a maximum signal. The resonator characteristics that determine the resonant frequencies thereby determine the first frequency $f_0$.

The second frequency of minimum attenuation occurs because, neglecting power losses in the resonators, the complex impedances $Z_a$ of resonator pair 130-140 and $Z_b$ of resonator pair 150-160 may be considered purely imaginary, as noted earlier. The imaginary component of the impedance values (reactance) of a resonator as a function of frequency is shown in the graph of FIG. 1c. Inside the frequency band $f_{sa} < f < f_{pb}$, the impedances of resonator pairs 130-140 and 150-160 have opposite signs, and their product $Z_a Z_b$ is thus real and positive within this frequency band. When the condition $R = \sqrt{Z_a Z_b}$ is satisfied, the expression for filter transfer function becomes:

$$H = \frac{R - Z_a}{R + Z_a} = \frac{R - Z_b}{R + Z_b}. \qquad (2)$$

Since $Z_a$ and $Z_b$ are both purely imaginary, the magnitude of H becomes $$\sqrt{\frac{R^2 + Z_a^2}{R^2 + Z_a^2}},$$

or 1, at maximum (minimum attenuation of 0 dB). The value of the product $Z_a Z_b$ increases monotonically from 0 to infinity in the interval $f_{sa} < f < f_{pb}$. Thus, the condition $R = \sqrt{Z_a Z_b}$ will be satisfied for some value of f. FIG. 2c is a graphical representation of the attenuation vs. frequency within the passband of a lattice filter at a particular resistance value, showing two different attenuation minima in the passband.

While the passband in a lattice filter can be tuned by adjusting the resistances of the circuit, there are several difficulties with using this technique. First, the resistances affecting attenuation in a lattice filter include resistance values external to the filter circuit, i.e., the source and load resistances 120 and 180 in FIG. 1a. These resistances are exterior to the input terminals 112 and 114, and the output terminals 176 and 178, respectively. As such, their values are not necessarily accessible for adjustment in most applications. Second, because the resistors are connected to different parts of the circuit, their coordinated variation would be difficult to achieve.

In filter design, filter response may also be shaped by creating transmission zeros, or frequencies at which input signals are completely blocked by the system. The monotonically increasing frequency response of the lattice filter in the stopbands is due to the lack of transmission zeros in its transfer function. The existence of transmission zeros depends on the parameters of the resonators used in the circuit; and, if necessary, transmission zeros can be created by an appropriate design of the filter. A lattice filter based on piezoelectric resonators can have two transmission zeros—one below the passband and another above the passband.

If a lattice filter is loaded by some resistance R, its input impedance is equal to R at the frequency which satisfies $R = \sqrt{Z_a Z_b}$. This property facilitates the connection of multiple lattice filters in cascade. The input impedance of the filter does not change significantly for the other passband frequencies, and the cascade connection of several lattice stages does not significantly increase the maximum passband attenuation.

A significant disadvantage of FBAR lattice filters is the large number of resonators, a minimum of four for a single stage lattice filter. In addition, each pair of resonators must have identical operating parameters. Similarly, tuning elements of a lattice filter that are parts of the filter circuit must also have identical operating parameters. The use of tuning elements outside of the lattice, suggested in some prior art, results in the tuning elements being applied to all resonators in the lattice and simultaneously changing the resonance frequencies of all resonators. Thus, it is impossible to independently tune the parameters of the longitudinal and of the crossed resonators, further complicating and reducing the flexibility of the tuning process.

Another disadvantage of such filters is evident in the creation of transmission zeros. Transmission zeros (attenuation poles) are created in lattice filters by proper choice of the parameters of the resonators, effectively, choice of the values of the elements of their equivalent circuits. However, elements added to tune the filter passband alter the equivalent circuit of the combination of the FBAR and the tuning elements, affecting the position of the transmission zeros. Thus, it is difficult to achieve independent tuning of the passband and concurrent placement of the transmission zeros.

In summary, designing thin film resonators to conform to application-related specifications is driven by requirements for precise control of the resonance frequencies, optimal connections, maximum Q-factors, and purity of the main resonance. The resonance frequency is affected by both the resonator and the electrode thicknesses, necessitating precise control over the thickness and properties of the layers during manufacture. The design of the electrodes further represents trade-offs between low sheet resistivity, efficient electromechanical coupling, and high acoustic quality of the materials used Limitations in manufacturing processes dictate the necessity of tuning the filters post-manufacture to conform to operating specifications. However, the tuning of resonance frequencies of identical resonators in conventional lattice filters is a complex procedure because the additional circuit elements must be matched and because other interactions of circuit elements are affected by the tuning process.

Therefore, a need exists to provide a filter that is less complicated to manufacture, with operating parameters that can be easily adjusted and tuned to conform to stringent application specifications. A need also exists to identify methods for tuning such a filter. The circuit and methods herein described address these deficiencies and related problems.

SUMMARY OF THE INVENTION

A filter circuit comprises a first amplifier that receives an input signal at an input port and generates a differential output signal at a positive output port and a negative output port. The circuit further comprises a first resonator having a series and a parallel resonant frequency connected to the positive output port of the first amplifier and a second resonator with a series and a parallel resonant frequency connected to the negative output port of the first amplifier. The outputs of the first and second resonators are electrically coupled to one another and further connected to an input port of a second amplification device, which receives the output of the first and second resonators and outputs a filtered signal.

The first resonator and second resonator may have third order or higher impedances. The series resonant frequency of one of the resonators is substantially equal to the parallel resonant frequency of the other resonator. The first resonator and second resonator may be film bulk acoustic resonators (FBARs), and the series and parallel resonant frequencies of the first and second resonators may be selected so that the first and second resonators pass a desired frequency range of the input signal. The first amplifier may have sufficiently high input and output impedances to minimize the effects on the input signal from resistances external to the filter circuit. The first amplifier may be an Operational Transconductance Amplifier (OTA), and may have adjustable gain. The second amplifier may be a transresistance amplifier or a current amplifier. At least one resistor, possibly a variable resistor, may be connected in series or in parallel to at least one of the output ports of the first amplifier. At least one capacitor, possibly a variable capacitor, may be connected in series or in parallel with at least one of the resonators. At least one inductor may be connected in series or in parallel with at least one of the resonators. At least one additional resonator, which may be an FBAR, may be connected in series or in parallel to at least one of the first and second resonators.

A method of filtering signals includes the activities of receiving a signal from a signal source and generating a differential output signal from the received signal at the positive output port and negative output port of a first amplifier. The differential ouput signal is passed through a first resonator connected to a positive output port of the first amplifier and a resistance at the positive output port of the first amplifier. The differential output signal is passed through a second resonator connected to a negative output port of the first amplifier and a resistance at the negative output port of the first amplifier. The outputs of the first resonator and the second resonator are electrically coupled to produce a combined signal. The combined signal is passed through a second buffering device to generate a filtered output signal. Passing the combined signal through the second amplification device may minimize the effects on the combined signal from an external load.

The method of filtering signals may further comprise adjusting internal resistances of the filter circuit to achieve a desired frequency passband. The adjustment may satisfy the condition $R=\sqrt{Z_a Z_b}$ where R is the internal resistance of the filter circuit, $Z_a$ is the complex impedance of the first resonator, and $Z_b$ is the complex impedance of the second resonator. The adjustment may apply a bias voltage to the first amplifier, or pass the positive differential signal or the negative differential signal through at least one resistor in series or in parallel with at least one of the output ports of first amplifier. The resistors may be variable resistors.

Alternatively or additionally, the differential output signal may be passed through at least one capacitor or inductor, connected in series or in parallel with at least one of the first resonator and second resonator of the filter circuit to achieve a desired filter passband. Alternatively or additionally, the differential output signal may be passed through at least one additional resonator, connected in series or in parallel with at least one of the first resonator and second resonator of the filter circuit to achieve a desired filter passband.

The method of filtering signals may further comprise adjusting the internal resistance to comprise two differing resistances, either by providing a first resistance at the positive output port of the first amplifier, and a different, second resistance at the negative output port of the first amplifier or by selecting or adjusting the first amplifier to have differing internal resistances at its positive output port and its negative output port to create transmission zeros in the filter transfer function. The resistance values of the two differing resistances may be adjusted to vary values of the transmission zeros in the filter transfer function.

BRIEF DESCRIPTION OF THE DRAWINGS

FIG. 1b shows the series and parallel resonance frequencies in the resonators of the prior art filter circuit of FIG. 1a;

FIG. 2a is a graphical representation of attenuation vs. frequency in a prior art FBAR lattice filter as shown in FIG. 1a;

FIG. 3b is a graphical representation of a frequency response of the filter circuit of FIG. 3a;

FIG. 3c is a graphical representation of a simulated passband frequency response of the filter circuit of FIG. 3a;

DETAILED DESCRIPTION OF THE INVENTION

The filter circuit described herein contains only half the number of resonators of a conventional lattice filter. The circuit avoids the requirement in conventional lattice filters of matched pairs of identical resonators. Tuning of the resonance frequencies of the resonators in the filter circuit may be accomplished by using extra capacitors or inductors, the effects of which are separate and independent for each resonator. The amplifiers at the input and output of the filter further permit implementation of a variable gain within the filter passband. They also separate input and output impedances, allowing operation with different source and load resistances.

Figure 3A:
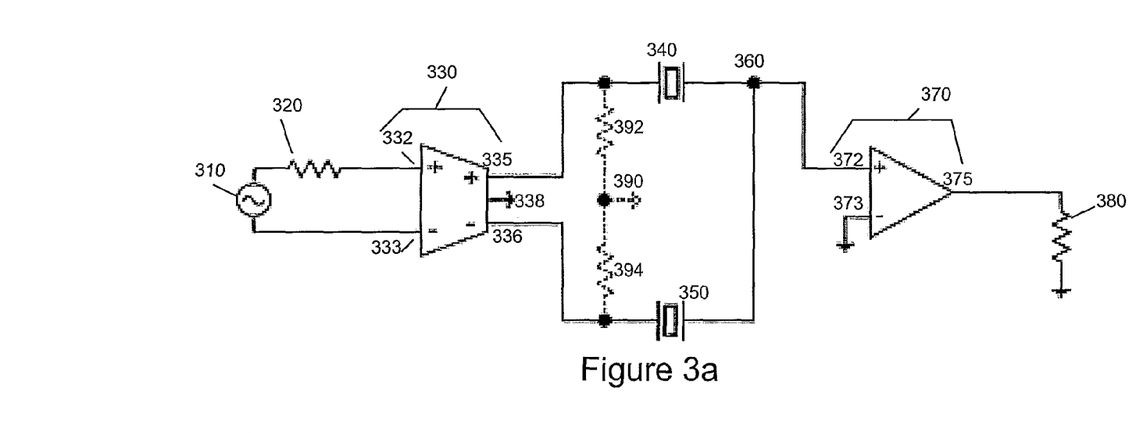
FIG. 3a is a circuit diagram of a filter according to invention principles.

FIG. 3a is a circuit diagram of a filter according to principles of the present invention. An input signal ($V_{in}$) is received from a signal source 310. An arbitrary resistance 320 represents the load of the circuit external to the filter input. The filter circuit may have an input amplifier 330, an output amplifier 370, and first and second resonators, 340 and 350 connected therebetween. Input amplifier 330 may have differential input ports 332 and 333, receiving a balanced input signal from the signal source 310. In alternative embodiments, the input of input amplifier 330 may be differential or single-ended, depending on other constraints of the filter implementation. Input amplifier 330 has differential output ports, 335 and 336. In FIG. 3a, input amplifier 330 is illustrated as an Operational Transconductance Amplifier (OTA), often used for signals in the GHz range. An additional terminal 338 shown connected to ground may be a middle, neutral point of the output. It can be either a dc biasing terminal or an intentionally added terminal of the amplifier. Alternatively, input amplifier 330 may be any amplifier having characteristics able to separate the signal source from the filter, and output the signal to be amplified as paired differential values. The input amplifier 330 has input and output impedance characteristics selected to reduce the effects of the internal impedance of the signal source on the filter frequency response. Input amplifier 330 converts a voltage at its input ports ($V_{in}$) to a differential current (voltage-to-current converter) at its output ports. Input amplifier 330 is characterized by the values of its transconductance (amplifier output current versus amplifier input voltage) and its input and output impedances. Input amplifier 330 may alternatively be realized as any other kind of amplifier operating in the expected signal frequency range, providing a differential output, and able to prevent the signal source internal impedance from affecting the filter parameters.

A first resonator 340 may be connected to a positive output port 335 of input amplifier 330. The first resonator 340 has two resonant frequencies, $f_{as}$ (series resonant frequency) and $f_{ap}$ (parallel resonant frequency). The resonant frequencies normally differ by about 2%-3% if FBAR resonators are used. However, the difference between the resonant frequencies may be smaller or larger. Recalling the behavior shown in FIG. 1c, for signals near its parallel resonant frequency, the reactance in the resonator is high; and first resonator 340 acts as an open circuit, blocking the signals. For signals close to its series resonant frequency, the reactance in the resonator is low, and first resonator 340 acts as a short circuit, passing the signals therethrough. In the circuit of FIG. 3a, resonator 340 is a Film Bulk Acoustic Resonator (an FBAR), and its first electrode is connected to the positive output port 335 of input amplifier 330. Alternatively, any resonator having a similar modified Butterworth-Van Dyke (MBVD) equivalent circuit may be used.

The second resonator 350 may be connected to a negative output port 336 of input amplifier 330. The second resonator 350 has two resonant frequencies, $f_{bs}$ (series resonant frequency) and $f_{bp}$ (parallel resonant frequency). The resonant frequencies normally differ by about 2%-3% if FBAR resonators are used. However, the difference may be smaller or larger. For signals close to its parallel resonant frequency, the reactance increases; and second resonator 350 acts as an open circuit, blocking the signals. For signals close to its series resonant frequency, the second resonator 350 acts as a short circuit, passing the signals therethrough. In the circuit of FIG. 3a, second resonator 350 is an FBAR, and its first electrode is connected to the negative output port 336 of input amplifier 330. Different resonators, such as quartz-crystal resonators, mechanical resonators, or other types, may be appropriately substituted, especially for different operational frequency ranges. Alternatively, any resonator able to accomplish the above filtering having a similar equivalent MBVD circuit may be used.

When the resonators are selected such that the series resonant frequency of the first resonator 340 is equal to the parallel resonant frequency of the second resonator 350, a single continuous passband of signal frequencies is created, approximately from $f_{as}$ to $f_{bp}$. The outputs of the first and second resonators are coupled together at an input port 372 of output amplifier 370, providing an input signal of frequency range substantially between $f_{as}$ and $f_{bp}$ to output amplifier 370. Alternatively, other types of resonators or circuit elements exhibiting the characteristics required to accomplish this filtering may be substituted for the FBARs illustrated in FIG. 3a, including but not limited to quartz crystals, piezoceramic resonators, or ferroelectric resonators.

Output amplifier 370 has a very small input impedance (0 in the ideal case). The input port 372 of output amplifier 370 may be single-ended, while its output may be either single-ended or differential, depending on the filter implementation. (In the example, the negative input port 373 is shown connected to ground.) The very small input impedance allows summing of the currents through the resonators 340 and 350 without affecting the values of these currents. The output amplifier produces a signal (output voltage or output current), which is proportional to the sum of the currents through the resonators. In the circuit of FIG. 3a, output amplifier 370 is shown as a transresistance amplifier (output voltage vs. input current), producing a voltage signal at its output port 375. Output amplifier 370 may alternatively be a current amplifier (output current vs. input current), such as a common-base amplifier (with bipolar transistors) or common-gate amplifier (with field-effect transistors), or any other amplifier able to separate the load from the filter, avoiding the influence of the load impedance on the filter frequency response and produce an output signal proportional to the sum of the currents through the first resonator and second resonator. The circuit load external to the output port of output amplifier 370 is shown for purposes of example as a single resistance 380.

Resistors 392 and 394 are drawn in dashed lines in parallel across the two arms of the circuit. Resistors 392 and 394 represent either the output resistances of both halves of input amplifier 330, or a combination of those values with additionally added resistors as discussed further below. The resistors are representative of inherent resistances within the filter circuit and are not necessarily present as elements of the circuit.

Analysis of the circuit of FIG. 3a gives the following expression for the filter transfer function:

$$H = \frac{V_{in}}{V_{out}} = \frac{g_{m1} r_{m2} R(Z_b - Z_a)}{(R+Z_a)(R+Z_b)}, \qquad (3)$$

where:
$Z_a$ is the complex impedance of first resonator 340;
$Z_b$ is the complex impedance of second resonator 350;
$g_{m1}$ is the transconductance of input amplifier 330;

$r_{m2}$ is the transresistance of output amplifier 370 (with included external load resistance 380);

R is the value of the internal resistor 392 or 394.

As discussed earlier, the transfer function of a conventional lattice filter using resonators is given by equation (1), repeated here for convenience:

$$H = \frac{R(Z_b - Z_a)}{(R + Z_a)(R + Z_b)}. \tag{1}$$

The similarity of equations (1) and (3) indicates that the attenuation of the signal passing through the filter circuit should be similar to the attenuation of the signal passing through a conventional lattice filter, i.e., the frequency behavior should be similar to that of a lattice filter. This similar behavior may be seen in the solid line of attenuation vs. frequency in the graphs of FIGS. 3b and 3c. The only difference in the equations is the presence of the factor $g_{m1}r_{m2}$ in the numerator of equation (3). This factor reflects the gain of the amplifiers, and its presence indicates that the filter circuit in FIG. 3a also allows for arbitrary amplification of the signal.

Thus, the filter circuit of FIG. 3a has the properties of the lattice filter, although it includes only two resonators. The requirement that $f_{ap}=f_{bs}$ also holds for this filter circuit. However, it is a less stringent constraint, since it applies only to single resonators rather than being a requirement for each of the matched resonator pairs as in a conventional lattice filter.

Figure 3B:
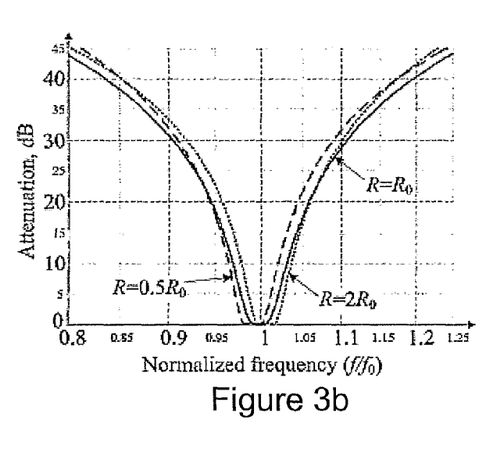
Figure 3C:
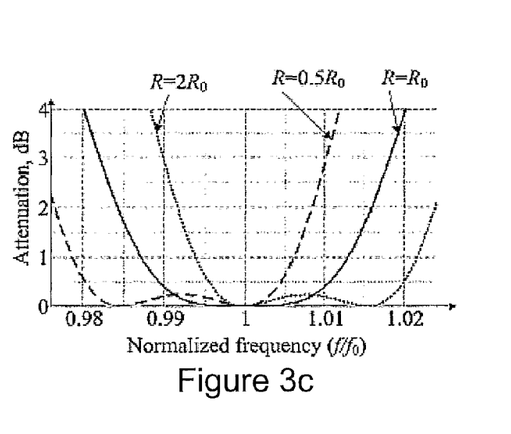

The graphs of FIGS. 3b and 3c illustrate the behavior of the circuit with regard to signal attenuation. FIG. 3b shows the signal attenuation across the normalized frequency range, while FIG. 3c is a more detailed representation of signal attenuation within the passband. The filter circuit exhibits good signal selectivity, with narrow roll-off. The circuit also allows an adjustable gain in the passband, achieved by varying the gain of the amplifiers.

The filter circuit has two frequencies of minimum attenuation, one at the frequency $f_0=f_{pa}=f_{sb}$, and the other at the frequency that satisfies the condition $R=\sqrt{Z_a Z_b}$, where R is the resistance of the filter circuit. In this circuit, however, R represents only the resistance internal to the filter, since amplifiers 330 and 370 prevent the external source and load impedances from affecting the filter frequency response. Changing this resistance causes a corresponding adjustment of the passband, as seen in FIGS. 3b and 3c (dashed line and dotted line).

FIGS. 3b and 3c are graphical representations of a frequency response of the filter in FIG. 3a with a normalized frequency, for different values of the resistance R. In the graphs, $f_{sa}=0.975$, $f_0=f_{pa}=f_{sb}=1$, and $f_{pb}=1.0256$. FIG. 3b shows the overall frequency response; and FIG. 3c shows the passband frequency response in greater detail. The three different response curves represent R values of $R=R_0$ (solid line), $R=0.5R_0$ (dashed line), and $R=2R_0$ (dotted line), where $R_0$ is the value of the product $Z_a Z_b$ at $f_0$. As the graphs indicate, increasing the internal resistance moves the passband to a higher frequency range, and decreasing the internal resistance moves the passband to a lower frequency range.

Thus, the filter circuit advantageously provides a straightforward tuning mechanism for adjusting the filter passband. The amplifiers 330 and 370 in FIG. 3a act to isolate the filter from the loads on the circuit, serving as buffers from the remainder of the circuit external to the filter and permitting differing terminating resistances 320 and 380 at both sides of the filter. Because the influence of the load resistances on the filter frequency response is avoided, the load resistances can be arbitrary. The resistances 392 or 394 (R in formula (1)) are completely internal to the circuit. Since the values of these resistances are not affected by the outer circuitry, using them for tuning the filter passband is a straightforward procedure.

The tuning range achieved by varying the resistors is limited by the frequencies $f_{sa}$ and $f_{pb}$, and by the hump in the frequency response that appears between the two frequencies of minimum attenuation when the resistance R differs from the value of $R_0$ for frequency $f_0$ (best seen in FIG. 3c). The hump of the second limitation only becomes significant in size when the frequency for which $R=\sqrt{Z_a Z_b}$ is very close to the conditional bounds $f_{sa}$ or $f_{pb}$. Thus, the tuning range of resistance adjustment is approximately the same as for FBAR lattice filters tuned by adding additional capacitors.

Adjusting the passband of the filter by varying resistors 392 and 394 has several advantages in actual practice. First, resistors usually consume less chip area than inductors and capacitors. Moreover, the resistors 392 and 394 can be part of input amplifier 330, i.e., they need not even exist as separate elements in the physical circuit. Also, while capacitors and inductors added in parallel or in series to the resonators decrease the Q-factors of the resonators, adjusting the resistances does not affect the resonator Q-factor. Further, although the passband bandwidth is narrowed by varying the resistor values, the effect is much less than if capacitors are added to the circuit. Finally, tuning the passband by adjusting resistor values does not preclude adjusting the resonator frequencies with extra inductors and capacitors. The combination of both tuning methods permits more flexibility in design and operation.

Variation of the values of the resistors 392 and 394 can be accomplished in several ways. For example, the output resistance of input amplifier 330 may be tuned by changing the DC quiescent point of its output stage (biasing the amplifier). Alternatively, variable resistors can be added in parallel or in series to the outputs of input amplifier 330. These resistors can be tuned electronically by DC voltage or current. The resistances may also be provided by resistor banks, consisting of a plurality of resistors and electronic switches for selecting to include them into the filter circuit. Any alternative technique or combination of techniques may be used that adjusts the value of the internal resistance in the filter circuit, to accomplish tuning of the passband frequency.

Figure 4A:
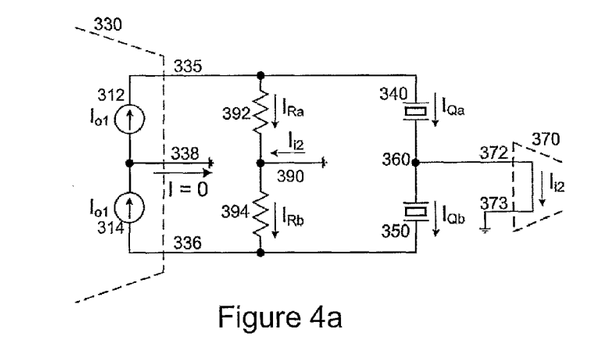
FIG. 4a is a circuit diagram of a simplified model of the filter circuit for purposes of explanation.

FIG. 4a shows a simplified model of the filter circuit. Circuit elements corresponding to elements in FIG. 3a are identified with similar reference numbers. The output of the first amplifier 330 in FIG. 3a is here represented by two current sources, 312 and 314, with identical currents $I_{o1}$. These currents are controlled by the filter input voltage according the relationship:

$$I_{o1}=g_{m1}V_{in}.$$

Since the currents through the positive 335 and negative 336 output ports of the first amplifier preferably have substantially equal magnitudes, the current through the grounded terminal 338 is substantially 0, as shown in FIG. 4a.

Resistors 392 and 394 are shown outside of first amplifier 330. These resistors could be part of the first amplifier (the output resistances of this amplifier). Alternatively, the resistors 392 and 394 may be a combination of the amplifier output resistances and externally added resistors. To simplify the analysis, first amplifier 330 is considered as an ideal transconductance amplifier with infinite output impedance, and its output resistances 392 and 394 are considered as externally added in parallel to the outputs 335 and 336.

The second amplifier 370 may have zero input impedance. Its input current $I_{i2}$ is taken from the point 360 between the two resonators 340 and 350. This current returns at the point 390 between resistors 392 and 394 after passing through the input of the second amplifier 370 and through ground. Thus, resistors 392 and 394 and resonators 340 and 350 form a bridge circuit, and the current $I_{i2}$ is the imbalance current of the bridge. The filtering properties are defined by the relationship between the currents $I_{o1}$ and $I_{i2}$, since $I_{o1}$ is proportional to the filter input voltage or input current; and $I_{i2}$ is proportional to the filter output voltage or output current.

The sum of the currents $I_{Ra}$ through resistor 392 and $I_{Qa}$ through first resonator 340 may be substantially equal to $I_{o1}$. The voltages over these two elements may be substantially equal, since the voltage drop over the input of second amplifier 370 may be substantially 0. Resonator 340 behaves like a reactive element: as an inductor between $f_{sa}$ and $f_{pa}$, and as a capacitor at other frequencies. The current through resistor 392 is $V/R_a$, where V is the voltage over the resistor and $R_a$ is its resistance. The current through resonator 340 is $V/(j2\pi f L_{eq})$ when the resonator behaves like an inductor ($L_{eq}$ is the equivalent inductance). The current is $V \times (j2\pi f C_{eq})$ when the resonator behaves like a capacitor ($C_{eq}$ is the equivalent capacitance). Thus, the current $I_{Qa}$ through resonator 340 is shifted by 90° behind the current $I_{Ra}$ when the resonator acts as an inductor; and shifted by 90° ahead of $I_{Ra}$ when the resonator acts as a capacitor.

Similar analysis and similar conclusions hold for resistor 394 and resonator 350: the current $I_{Qb}$ through resonator 350 is shifted by 90° behind the current $I_{Rb}$ when the resonator is equivalent to an inductor, and is shifted by 90° ahead of $I_{Rb}$ when the resonator acts as a capacitor.

Resonators 340 and 350 have opposite behavior within the passband. In the band $f_{sa}<f<f_{pa}=f_{sb}$, resonator 340 is equivalent to an inductor, while resonator 350 behaves like a capacitor in the same frequency range. In the remainder of the passband, $f_{sb}=f_{pa}<f<f_{pb}$, their characteristics are interchanged: resonator 350 is equivalent to an inductor, while resonator 340 is equivalent to a capacitor.

Figure 4B:
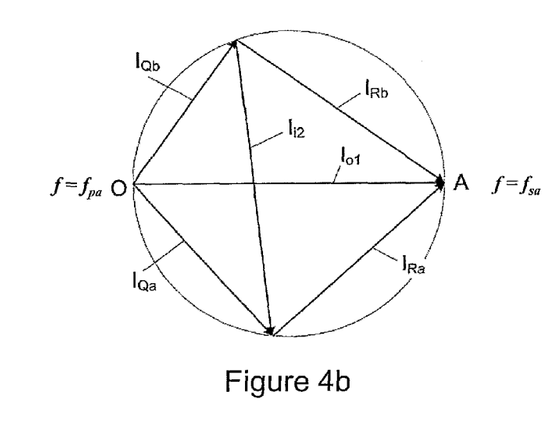
FIG. 4b is a graphical representation of the current phasors of the filter circuit of FIG. 4a in the frequency passband.

FIG. 4b shows the relationship of the phasors of the currents through the two resonators (representing the amplitudes and phases of the currents) in the frequency band $f_{sa}<f<f_{pb}$. For resonator 340, the currents $I_{Ra}$ through resistor 392 and $I_{Qa}$ through resonator 340 are in quadrature, and their sum is equal to $I_{o1}$. Thus, the phasors $I_{o1}$, $I_{Qa}$ and $I_{Ra}$ form a right triangle. If they are plotted as shown in FIG. 4b, the end of $I_{Qa}$ moves along the lower semicircle as the frequency varies from $f_{sa}$ to $f_{pa}$. Initially, when $f=f_{sa}$, the end of $I_{Qa}$ is at point A, since resonator 340 is in series resonance at this frequency; and the whole current $I_{o1}$ flows through the resonator, while the current through resistor 392 is 0. As f moves to $f_{pa}$, the end of $I_{Qa}$ moves along the lower semicirle to point O, which corresponds to zero length of the phasor. At this frequency, resonator 340 has a parallel resonance, and the current through the resonator is 0, while the current through resistor 392 is substantially equal to $I_{o1}$.

For resonator 350, the currents $I_{Qb}$ and $I_{Rb}$ are also in quadrature; and their sum is equal to $I_{o1}$. The end of $I_{Qb}$ moves along the upper semicircle in FIG. 4b. When $f=f_{sa}$, the endpoint of $I_{Qb}$ is somewhere on the semicircle. Its location depends on parameters of resonator 350 and the values of the resistors. As the frequency varies from $f_{sa}$ to $f_{pa}$, the endpoint of $I_{Qb}$ moves toward point A. The end of $I_{Qb}$ coincides with point A at $f=f_{pa}=f_{sb}$. Since resonator 350 has series resonance at this frequency, it is equivalent to a short circuit; and the entire current $I_{o1}$ flows through resonator 350. In the other part of the passband, $f_{sb}<f<f_{pb}$, the picture is opposite: the end of phasor $I_{Qb}$ moves along the lower semicircle, running through the whole semicircle from point A to point Q. During the same time, the end of $I_{Qa}$ moves through a part of the upper semicircle, running from point O (at $f=f_{sb}$) to a different point on the semicircle (the location of this point depends on the resistors and the equivalent capacitance of the resonator).

Assuming the current directions as shown in FIG. 4a, we can write for the input current of the second amplifier 370:

$$I_{i2}=I_{Qa}-I_{Qb}.$$

The phasor $I_{i2}$, representing the input current of amplifier 370, connects the ends of phasors $I_{Qa}$ and $I_{Qb}$. These ends are at opposite sides of the circle of diameter $I_{o1}$, and the length of $I_{i2}$ is relatively large, corresponding to the large gain of the filter inside the passband. The maximum length of this vector is equal to the diameter of the circle $I_{o1}$, and it can be reached twice: first at the frequency $f_{pa}=f_{sb}$, when phasor $I_{Qa}$ is 0 and phasor $I_{Qb}$ is identical with $I_{o1}$; and also at the frequency for which the vector $I_{i2}$ passes through the center of the circle. The filter has maximum gain at these two frequencies.

Figure 4C:
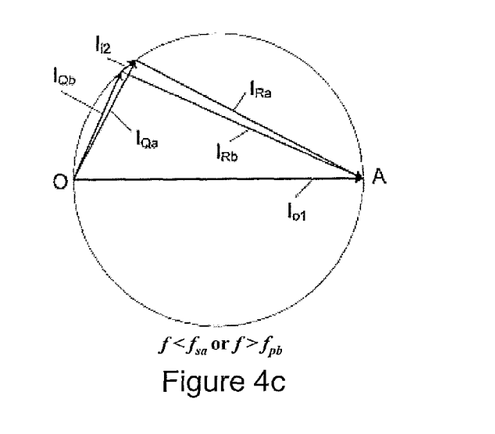
FIG. 4c is a graphical representation of the current phasors of the filter circuit of FIG. 4a in the frequency stopband.

Inside the stopband, both the resonators behave like capacitors. They have values close to their equivalent capacitances, which define approximately equal phasors $I_{Qa}$ and $I_{Qb}$. FIG. 4c shows the phasors of the currents in this case. The ends of the phasors $I_{Qa}$ and $I_{Qb}$ are close to each other, and the distance between their ends is small, which explains the small filter gain in the stopband.

Figure 6:
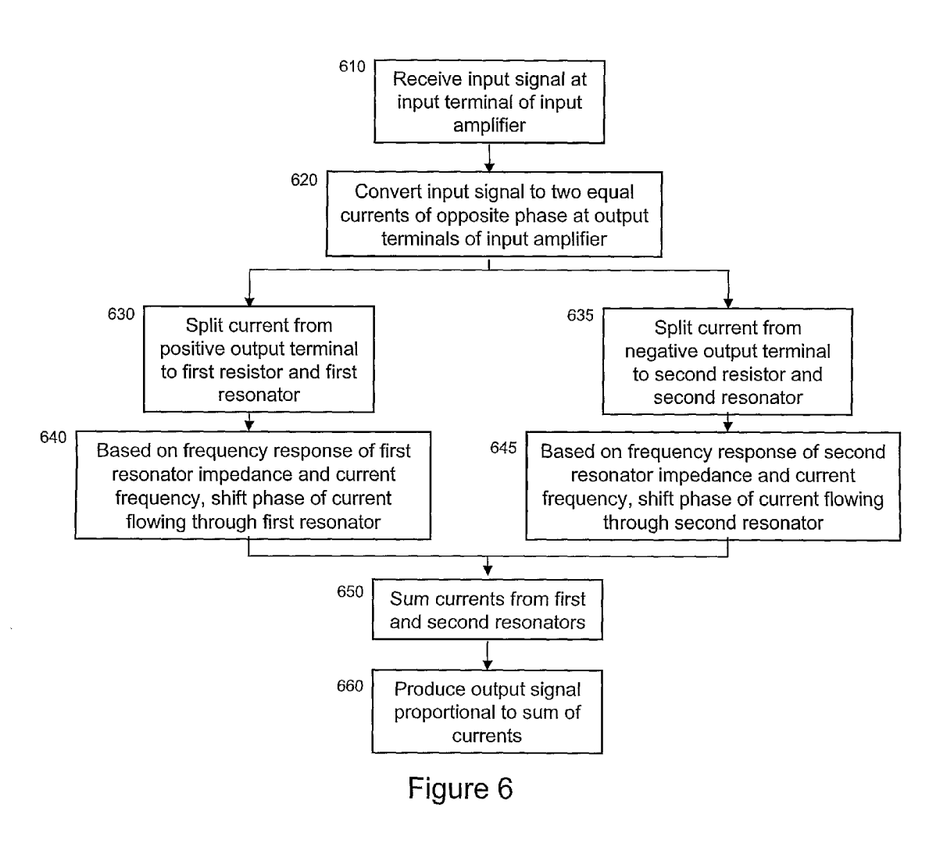
FIG. 6 is a flowchart illustrating a method of filtering signals using a circuit according to invention principles.

An exemplary method of filtering signals using the circuit of FIG. 3a is shown in the flow diagram of FIG. 6. An input signal may be received at an input port of an input amplifier 330 as discussed in step 610. Alternatively, a balanced input signal may be received at both input ports 332 and 333 of an input amplifier 330 that accepts balanced input signals. The input amplifier 330 separates the signal from the internal impedance 320 of the signal source as stated in step 620, so that filter operating parameters are not significantly affected by the signal source internal impedance. Differential output signals (voltage or current) may be generated by input amplifier 330 at positive 335 and negative 336 output ports. In the described embodiment, input amplifier 330 converts the input signals to substantially equal currents at output ports 335 and 336, and the remainder of the filtering method uses terminology based on currents. In an alternative and equivalent embodiment not further herein described, the input amplifier may convert the input signal to equal voltages, and the resistors 392 and 394 may be in series with these voltages and resonators 340 and 350 respectively.

The current from the positive output port 335 of input amplifier 330 is split between the first electrode of a first resonator 340 and resistor 392 as described in step 630. When the frequency f of the current passing through the first resonator is less than its series resonant frequency ($f_{sa}<f$), the resonator acts like a capacitor. When the frequency f of the current passing through first resonator 340 is between its series resonant frequency and its parallel resonant frequency ($f_{sa}<f<f_{pa}$), the resonator acts like an inductor. When the frequency f of the current passing through first resonator 340 is greater than its parallel resonant frequency ($f_{pa}<f$), resonator 340 again acts like a capacitor. Based on the frequency of the current and the frequency response of the impedance of first resonator 340, the current flowing through first resonator 340 is shifted in phase by resonator 340 in step 640, as illustrated in FIG. 4b.

The current from the negative output port of input amplifier 330 is split between the first electrode of a second resonator 350 and resistor 394 as discussed in step 635. The second resonator 350 is selected such that its series resonant frequency $f_{sb}$ is substantially equal to the parallel resonant frequency $f_{pa}$ of the first resonator 340. When the frequency f of the current passing through the second resonator 350 is less than its series resonant frequency ($f_{sb}$<f), resonator 350 acts like a capacitor. When the frequency f of the current passing through second resonator 350 is between its series resonant frequency and its parallel resonant frequency ($f_{sb}$<f<$f_{pb}$), resonator 350 acts like an inductor. When the frequency f of the current passing through second resonator 350 is greater than its parallel resonant frequency ($f_{pb}$<f), resonator 350 again acts like a capacitor. Based on the frequency of the current and the frequency response of the impedance of second resonator 350, the current flowing through second resonator 350 is shifted in phase by resonator 350 as stated in step 645, as illustrated in FIG. 4b.

Because of the relationship of their resonant frequencies, in the frequency range $f_{sa}$<f<$f_{pa}$=$f_{sb}$, first resonator 340 acts like an inductor while second resonator 350 acts like a capacitor. Further, in the frequency range $f_{pa}$=$f_{sb}$<f<$f_{pb}$, second resonator 350 acts like an inductor while first resonator 340 acts like a capacitor. These two ranges define the passband of current frequencies for the filter. The currents through the resonators have opposite phases at the ports of input amplifier 330. The phases of the currents are shifted by the resonators, as shown in FIG. 4b, and thus have similar phases at the input of the output amplifier 370. Outside this frequency range, both resonators act as capacitors. Currents having frequencies outside this range are attenuated by both resonators since they have opposite phases and approximately equal amplitudes when summed at the output amplifier 370.

Currents passed through the second resonator and the first resonator may be jointly received and summed at an input port of a second amplifier 370 as discussed in step 650. A filtered signal of frequency values between $f_{sa}$ and $f_{pb}$ may be generated at the output port 375 (or differential output ports) of second amplifier 370, proportional to the summed current through its input as described in step 660. As discussed earlier, the output of amplifier 370 may be either single-ended or differential, and may be either current or voltage. As further discussed above, the passband may be adjusted to conform to specific design requirements by varying the internal resistances of the filter circuit, either by adjusting the output resistances of the first amplifier, or by adding variable resistors to the filter circuit.

As discussed earlier, the shaping of filter response in filter design is also accomplished by creating transmission zeros. Referring back to the filter circuit of FIG. 3a, allowing the resistances $R_a$ 392 and $R_b$ 394 to take on differing values can define transmission zeros. When the internal resistances have differing values, the filter transfer function is given by:

$$H = \frac{g_{m1} r_{m2} R_a R_b \left( \frac{Z_b}{R_b} - \frac{Z_a}{R_a} \right)}{(R_a + Z_a)(R_b + Z_b)}. \quad (4)$$

Figure 5A:
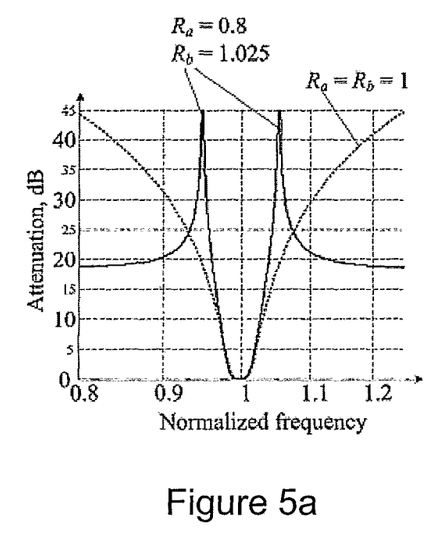
FIG. 5a is a graphical representation of the overall frequency response of a filter circuit according to invention principles.
Figure 5B:
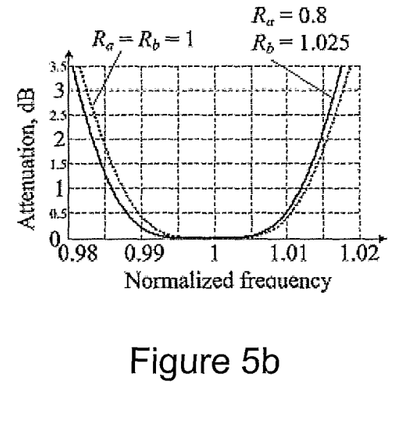
FIG. 5b is a graphical representation of the passband frequency response of a filter circuit according to invention principles.

The division of $Z_a$ by $R_a$ and $Z_b$ by $R_b$ in the numerator of equation (4) amounts to an independent scaling of the two impedances, while preserving their resonance frequencies. When the internal resistances 392 and 394 have differing values, a difference in the impedance levels is introduced, allowing the creation and adjustment of transmission zeros, as shown in FIGS. 5a and 5b by the solid line. As seen in the graph of FIG. 5b, the change in frequency response within the passband is very small when the values of the resistors and the resonator parameters are chosen properly. Thus, the frequency response with differing values of $R_a$ (392 in FIG. 3a) and $R_b$ (394 in FIG. 3a), represented by the solid line in FIGS. 5a and 5b, exhibits points of extremely high attenuation at the edges of the passband. However, there is very little difference in response within the passband compared to the response of the same circuit with equal internal resistances (dotted line).

Differing resistor values can be achieved in any of a number of ways. One method is by introducing appropriate asymmetry into the output stage of input amplifier 330. Another is adding extra resistors to the outputs 335 and 336 of input amplifier 330 in series or in parallel with the first resonator or the second resonator. Additionally, any other method that varies the values of the two internal resistances 392 and 394 may be employed to accomplish the creation and variation of transmission zeros in the filter circuit.

Using differing resistances to create transmission zeros has several advantages over other methods used in the lattice filter design, which require selecting appropriate resonator parameters and using additional capacitors and inductors to create transmission zeros. First, using differing resistances relaxes the strict requirements on the values of the resonators. Additionally, adjusting the resistances allows relatively independent manipulation of the location of transmission zeros based on the difference between the resistor values; and of the location of the filter passband based on the magnitudes of the resistor values. Also, it is much easier to vary resistances in an integrated circuit than capacitors or, even worse, inductors. Finally, using differing internal resistors to introduce transmission zeros does not exclude using capacitors and inductors. Both techniques can be used concurrently. For example, transmission zeros can be introduced, and their positions can be defined roughly, by proper design of the resonators 340 and 350 and/or by adding extra capacitors or inductors in parallel or in series to the resonators. Then, the resistances 392 and 394 can be used for fine tuning of the positions of the transmission zeros and the passband boundaries.

Resistors 392 and 394 permit easy tuning of the passband central frequency and creation and adjustment of transmission zeros. However, adjusting the resistances does not significantly change the passband bandwidth, which extends essentially from the lower series resonance frequency to the higher parallel resonance frequency of the resonators in the circuit. Narrowing or broadening the passband bandwidth requires adjusting the resonator frequencies. The resonator frequencies may be adjusted by adding additional capacitors and/or inductors in parallel or in series to the resonators. Exemplary circuits including capacitors or inductors to adjust the filter passband are shown in FIGS. 7a-d.

Figures 7A, 7B, 7C, 7D, 7E:
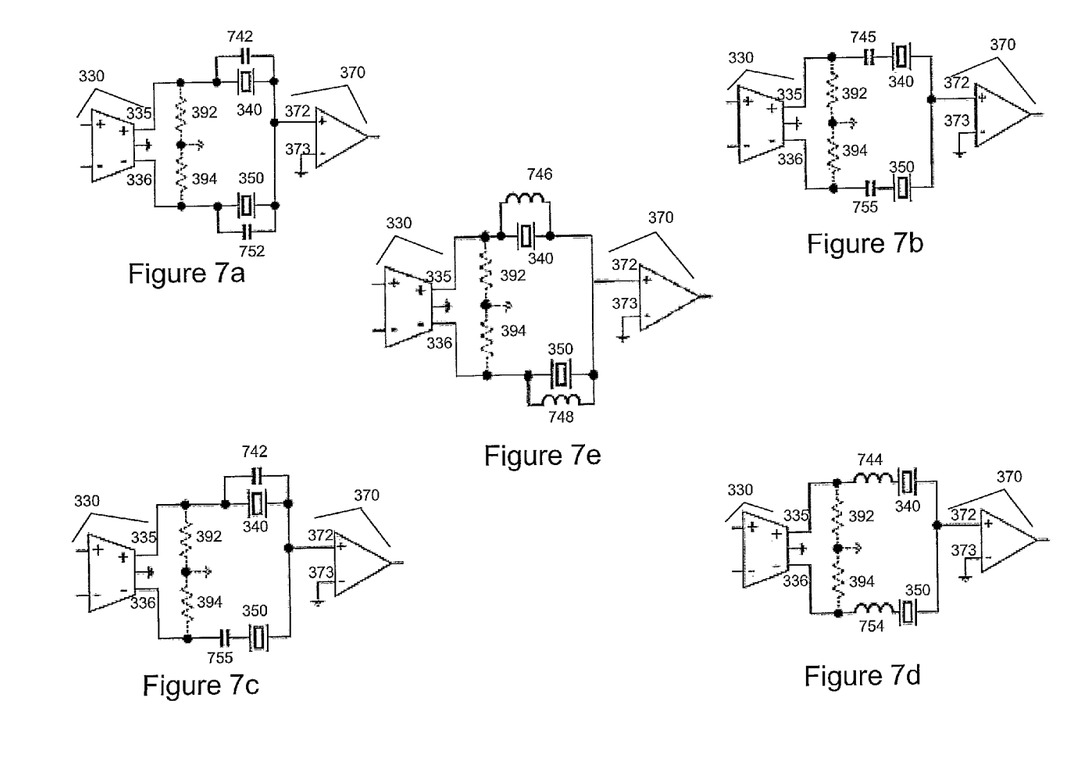
FIG. 7a is a circuit diagram of a filter according to invention principles with additional parallel capacitors.
FIG. 7b is a circuit diagram of a filter according to invention principles with additional series capacitors.
FIG. 7c is a diagram of a circuit according to invention principles with additional capacitors.
FIG. 7d is a circuit diagram of a filter according to invention principles with additional series inductors.
FIG. 7e is a circuit diagram of a filter according to invention principles with additional parallel inductors.

FIG. 7a shows a circuit in which parallel capacitors 742 and 752 are added to resonators 340 and 350 respectively. Adding a capacitor in parallel increases the total parallel capacitance, and the parallel resonance frequency $f_p$ of the resonator 340 and capacitor 742 combination is lowered. Similarly, the parallel resonance frequency $f_p$ of the resonator 350 and capacitor 752 combination is lowered. The series resonance frequency $f_s$ is unchanged for both resonators. The parallel resonance frequency cannot be less than the series resonance, and the interval between $f_s$ and $f_p$ is reduced for both resonator-capacitor combinations.

FIG. 7b shows a circuit in which series capacitors 745 and 755 are added to resonators 340 and 350 respectively. Adding a capacitor in series with the resonator increases the series resonance frequency $f_s$ of the resonator and capacitor combination. The parallel resonance $f_p$ does not change. Again, the interval between the resonances $f_s$ and $f_p$ is decreased for both resonator-capacitor combinations.

In FIG. 7c, one capacitor 742 is added in parallel to the first resonator 340 and one capacitor 755 is added in series to the second resonator 350. In this case, the parallel capacitor 742 moves the parallel resonance frequency of the resonator and capacitor combination 340, 742 downward, while the series capacitor 755 moves the series resonance frequency of the resonator and capacitor combination 350, 755 upward. If the original resonant frequencies of resonator 340 overlap the original resonant frequencies of resonator 350, adding the capacitors 742 and 755 to the circuit can adjust the resonators 340 and 350 so that frequencies $f_{pa}$ and $f_{sb}$ are equal.

The circuits illustrated in FIGS. 7a-7c involve only capacitors, and the passband bandwidth is narrowed by adding capacitance. As indicated in FIG. 7d, inductors may be added in series 744 and 754 to resonators 340 and 350 respectively. The series inductor 744 in FIG. 7d introduces a second series resonance above the resonances of resonator 340. The first series resonance of the whole circuit is less than the original series resonance of resonator 340. However, the inductor does not change the parallel resonance frequency of resonator 340, and the interval between $f_{sa}$ and $f_{pa}$ is thus extended. This modification may be used to introduce more transmission zeros into the filter stopband.

Adding a parallel inductance to a resonator as shown in FIG. 7e introduces a second parallel resonance between 0 and the first series resonance. FIG. 7e adds inductors 746 and 748 in parallel to both resonators 340 and 350 in the circuit. This modification may be used to introduce other transmission zeros in the filter stopband. The series resonance of the combination is unchanged, since it is defined by the resonator 340. The effect of a parallel inductor 746 near the original resonance frequencies of the resonator 340 is effectively equivalent to decreasing the capacitance of the resonator. Thus, the basic parallel resonance frequency of the combination is increased, and the interval between $f_s$ and $f_p$ is extended.

The effects of these additional elements in the circuit can be generalized in a few statements. Extra elements connected in parallel with the resonator affect the parallel resonance frequency, while extra elements connected in series with the resonator affect the series resonance frequency. Capacitors shrink the interval between $f_s$ and $f_p$, while inductors extend it. Extra capacitors do not change the number of resonance frequencies, while extra inductors introduce additional resonances, which can be used to increase the number of transmission zeros of the filter. Additional alternative combinations of these modifications of the circuit may be produced. The circuits illustrated in FIGS. 7a-7e are merely exemplary and do not exhaust all possible circuit configurations. The tuning methods of using variable resistors discussed earlier can also be applied to filter circuits according to the principles of the present invention in combination with the use of extra capacitors and/or inductors as described above.

Adding inductors to the resonators cannot produce a significant extension of the passband bandwidth, and adding capacitors only narrows the bandwidth. The basic limitation is due to the much smaller values of series inductors. The Q-factors of on-chip inductors are small (typically less that 20). To avoid a significant deterioration of the overall Q-factor, the values of extra inductors must be much less than the inductors in the FBAR MBVD equivalent circuit.

Figure 8A:
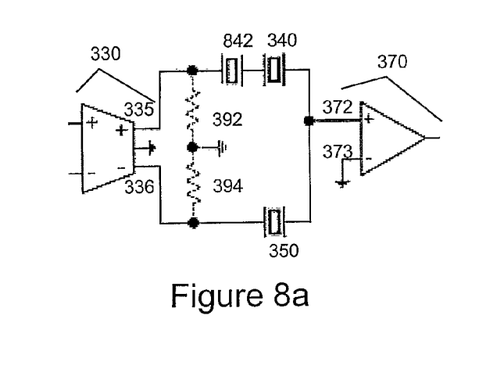
FIG. 8a is a circuit diagram of a filter according to invention principles with an additional resonator.
Figure 8B:
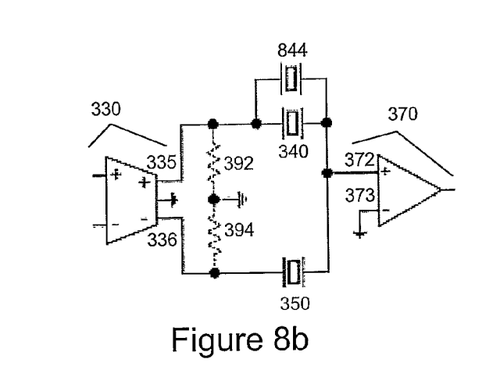
FIG. 8b is a circuit diagram of a filter according to invention principles with an additional resonator.
Figure 8C:
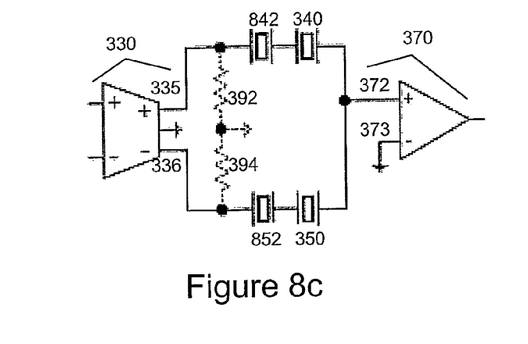
FIG. 8c is a circuit diagram of a filter according to invention principles with two additional resonators.

A significant broadening of the passband bandwidth can be achieved by using more than one resonator in each arm of the filter circuit. Diagrams of circuits incorporating this modification are shown in FIGS. 8a-8c. Additional resonators can be connected in series or in parallel with a resonator of the original circuit of FIG. 3a. The MBVD equivalent circuit of either connection is a fifth order LC circuit (neglecting loss resistances), exhibiting two series and two parallel resonances. When additional resonators are connected in series, the parallel resonances of the combination are the same as the initial parallel resonances, while the series resonances are changed. Parallel connection of the resonators, in contrast, preserves the initial series resonances but changes the parallel resonances.

FIGS. 8a-8c illustrate additional embodiments of the filter circuit that include additional resonators in series or in parallel. In FIG. 8a, two resonators are connected in series, 842 and 340, between the positive output port 335 of input amplifier 330 and the positive input port 372 of the output amplifier 370. In FIG. 8b, two resonators are connected in parallel, 844 and 340, between the positive output port 335 of input amplifier 330 and the positive input port 372 of the output amplifier 370. The two circuits are equivalent, and the choice of implementation may be made on other factors than filter behavior, such as ease of tuning based on the specific design constraints of the implementation. In FIG. 8c, additional resonators 842 and 852 have been added in series with first and second resonators 340 and 350 respectively. Resonator 842 is connected in series with resonator 340 between the positive output port 335 of input amplifier 330 and the positive input port 372 of output amplifier 370. Resonator 852 is connected in series with resonator 350 between the negative output port 336 of input amplifier 330 and the positive input port 372 of output amplifier 370.

In all of these cases, the location of the resonance frequencies of the resonators and of their combinations in each part of the circuit follows the basic rule for lattice circuits: the signs of the imaginary parts of the impedances in each section must be different within the passband. This condition requires some matching between the resonance frequencies of the impedances, which can be accomplished by adding capacitors or inductors in series or in parallel to the resonators as discussed earlier. Thus, every resonator in 8a-8c may be accompanied by tuning capacitors or inductors as discussed earlier with regard to FIGS. 6a-6e. Adding variable resistors 392 and 394 can also be used when the circuit contains additional resonators, because the effect of the resistors is independent of the number of resonators in each part of the circuit. In general, the use of more than one resonator in each part of the circuit increases the degree of the filter transfer function. The effect is a steeper slope in the transition bands between passband and stopband of the frequency response (more rapid roll-off).

In some applications, particularly when the signals through the filter are expected to be of relatively high power, use of output amplifier 370 could present difficulties. Since output amplifier 370 is a linear circuit element, its power efficiency is limited. For a higher power signal, such as in the last stages of a radio transmitter, the power efficiency is a major consideration in the design of the circuit. In general, however, FBAR filters are preferable for transmitters, since they can transmit relatively large power.

Figure 9:
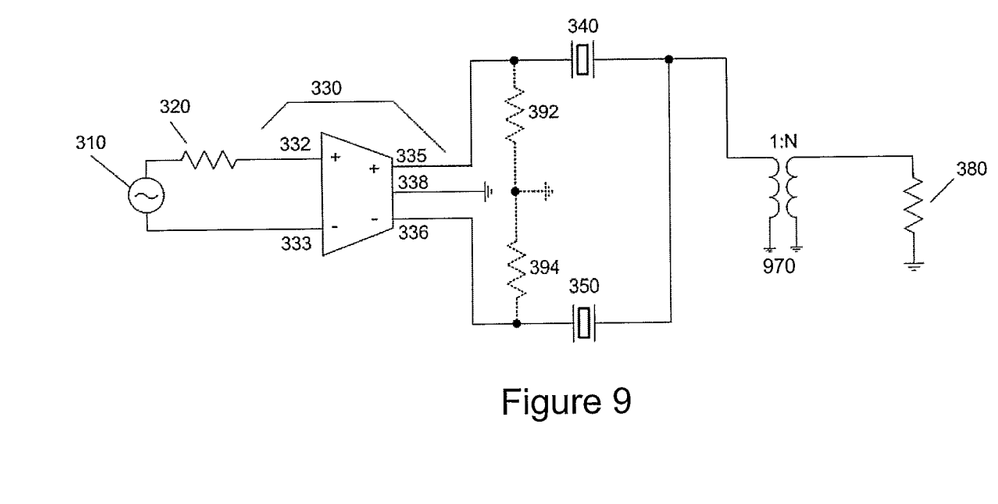
FIG. 9 is a circuit diagram of an alternative embodiment of a filter according to invention principles.

In an alternative embodiment of the filter circuit, shown in the circuit diagram of FIG. 9, output amplifier 370 may be replaced by a transformer 970 with transformer ratio 1:N, where N>1. The value of parameter N depends on the load impedance 380 and on the values of the resistors 392 and 394 (R). The effect of the load resistance 380 can be minimized by a proper choice of the ratio N. If N is chosen so that the input impedance of the transformer together with the load 380 is small enough, the circuit of FIG. 9 works similarly to the earlier described embodiment utilizing an output amplifier. This alternative embodiment can also be combined with any of the circuit modifications described previously and illustrated in FIGS. 7 and 8.

Transformers are not easily implemented in integrated circuits. However, in some cases, for example when the filter is the last stage of a transmitter, the transformer 970 may be connected externally between the transmitter output and the antenna.

The filter circuit described herein offers several significant advantages over the conventional FBAR lattice filter. The circuit requires half the number of resonators of an equivalent conventional lattice filter. The circuit avoids the use of identical resonator pairs required in lattice filters. Tuning of the resonance frequencies of the resonators by using extra capacitors or inductors can be done separately and independently for each resonator in the circuit. In contrast, the tuning of resonance frequencies of identical resonators in the lattice filters must be matched. The amplifiers at the input and output of the filter circuit permit a variable gain in the filter passband. The amplifiers separate input and output impedances, allowing operation of the circuit with differing source and load resistances.

Tuning the passband central frequency of the filter circuit can be accomplished by using two variable resistances in parallel to the output of the first amplifier. These resistances can be connected in parallel to the amplifier output between each output port and the ground; or in series to the amplifier output between each output port and the next resonator terminal. In another embodiment, the circuit uses the input amplifier output resistances themselves and varies them by changing the quiescent point of the output stage of the first amplifier. Tuning the frequency with variable resistances allows a tuning range similar to that of using variable capacitors connected in series or in parallel to the resonators. Using this tuning method requires less chip area for resistors than would be necessary for inductors and capacitors. In fact, use of the output resistances of the input amplifier can eliminate the need for resistors in the filter circuit. Using the amplifier output resistances (in possible combination with resistors external to the amplifier) for tuning the filter avoids the narrowing of the passband caused by additional capacitors and inductors. However, tuning the filter circuit by adjusting internal resistances does not preclude adjustment of the resonator frequencies by extra inductors and capacitors. The combination of both tuning methods provides better flexibility.

Creating transmission zeros and tuning their location in the transfer characteristic of the filter according to the principles of the present invention can be accomplished by adjusting the difference between the resistances of each output port of the input amplifier. Creating and adjusting the location of transmission zeros by this method relaxes the stringent requirements on the values of the resonator equivalent circuit when transmission zeros with prescribed locations are a requirement of the application. Thus, deviations of the elements of the circuit from specified operating parameters can easily be compensated for. Adjusting resistances of the output ports of the input amplifier to introduce transmission zeros does not preclude use of other methods. For example, transmission zeros can be introduced and their positions can be roughly defined by specification of the resonator characteristics, by adding extra capacitors or inductors in parallel or in series to the resonators, or by a combination of these methods. Varying the output resistances of the input amplifier can then be used to fine tune the positions of the zeros and the passband boundaries.

The filter circuit can be modified by adding capacitors or inductors in parallel or in series to one or to both resonators to allow control of the filter passband bandwidth. The filter circuit can also be modified by connecting more than one resonator in one or both arms of the circuit to extend the passband bandwidth and increase the slope in the transition bands between the passband and the stopband. The resonators may be further combined with capacitors or inductors for more accurate adjustments of their resonance frequencies. Tuning the central passband frequency and creating transmission zeros can also be performed on the modified basic circuit.

Connection of multiple stages of the filter circuit in cascade is also possible, when a steeper transition between passband and stopband is required than could be achieved by a single filter stage. Such a connection does not preclude or substitute for the use of more than one resonator in both arms of the filter circuit. Connecting more stages in cascade would preserve or shrink the pass-band (depending on the design parameters) and would increase roll-off in the stopband.

The systems and processes described are not meant to be exhaustive and do not exclude other systems and processes derived in accordance with the principles of the invention as claimed in the following claims to accomplish the same objectives. Although this circuit has been described with reference to particular embodiments, it is to be understood that the embodiments and variations shown and described herein are for illustration purposes only. Modifications to the current design may be implemented by those skilled in the art, without departing from the scope of the invention. Many modifications and variations of the present invention are possible in light of the teachings described herein, and this disclosure is intended to cover them.

What is claimed is:

1. A filter circuit, comprising:
    an amplifier having a positive output port and a negative output port, said amplifier receiving an input signal at an input port and generating a differential output signal at said positive output port and said negative output port;
    a first resonator having first and second terminals, wherein said first terminal is connected to said positive output port of said amplifier, said first resonator having a series resonant frequency and a parallel resonant frequency;
    a second resonator having first and second terminals, wherein said first terminal is connected to said negative output port of said amplifier, the second resonator having a series resonant frequency and a parallel resonant frequency such that the series resonant frequency of one of the first and second resonators is substantially equal to the parallel resonant frequency of the other of the first and second resonators;
    said second terminals of the first and second resonators being electrically coupled at a connection to sum signals passing therethrough; and
    a buffering device of substantially zero input impedance for receiving the electrically coupled signals passing through the first and second resonators and outputting a filtered signal.

2. The filter circuit of claim 1, wherein said buffering device is a second amplifier.

3. The filter circuit of claim 1, wherein said buffering device is a transformer.

4. The filter circuit of claim 1, wherein said first and second resonators have third order or higher impedances.

5. The filter circuit of claim 1, wherein said first resonator and said second resonator are film bulk acoustic resonators (FBARs).

6. The filter circuit of claim 1, wherein the resonant frequencies of said first and second resonators are selected to pass a desired frequency range of the input signal.

7. The filter circuit of claim 1, wherein the input impedance of said amplifier changes negligibly when its other parameters are controlled and output impedances of said amplifier have negligible dependence on signal source impedance.

8. The filter circuit of claim 1, wherein said amplifier is an Operational Transconductance Amplifier.

9. The filter circuit of claim 2, wherein said buffering device is a transresistance amplifier.

10. The filter circuit of claim 2, wherein said buffering device is a current amplifier.

11. The filter circuit of claim 8, wherein said Operational Transconductance Amplifier has an adjustable gain.

12. The filter circuit of claim 1 further comprising at least one resistor connected in series to at least one of said positive and negative output ports of said amplifier.

13. The filter circuit of claim 1, further comprising at least one resistor connected in parallel to at least one of said positive and negative output ports of said amplifier.

14. The filter circuit of claim 12, wherein said at least one resistor connected in series to at least one of said positive and negative output ports of said amplifier is a variable resistor.

15. The filter circuit of claim 13, wherein said a east one resistor connected in parallel to at least one of said positive and negative output ports of said amplifier is a variable resistor.

16. The filter circuit of claim 1, further comprising at least one capacitor connected in parallel with at least one of said first and second resonators.

17. The filter circuit of claim 1, further comprising at least one capacitor connected in series with at least one of said first and second resonators.

18. The filter circuit of claim 1, further comprising at least one inductor connected in series with at least one of said first and second resonators.

19. The filter circuit of claim 1, further comprising at least one inductor connected in parallel with at least one of said first and second resonators.

20. The filter circuit of claim 1, further comprising at least one additional resonator connected in series to at least one of said first and second resonators.

21. The filter circuit of claim 1, further comprising at least one additional resonator connected in parallel to at least one of said first and second resonators.

22. The filter circuit of claim 20, wherein said additional resonator is an FBAR.

23. The filter circuit of claim 21, wherein said additional resonator is an FBAR.

24. A method of filtering signals, comprising the steps of:
receiving a signal from a signal source;
generating a differential output signal from the received signal at a positive output port and a negative output port of an amplifier;
passing the differential output signal through the positive output port of the amplifier, a first resistance, and a first resonator, said first resistance being adjusted to achieve a desired frequency response;
passing the differential output signal through the negative output port of the amplifier, a second resistance, and a second resonator, said second resistance being adjusted to achieve a desired frequency response;
combining outputs of the first resonator and the second resonator to sum the signals passed through the first resonator and the second resonator to produce a combined signal; and
passing the combined signal through a buffering device of substantially zero input impedance to produce a filtered output signal.

25. The method of claim 24, wherein passing the combined signal through the buffering device minimizes the effect of an external load on the filter operation.

26. The method of claim 24, further comprising the step of adjusting internal resistances to achieve a desired frequency passband.

27. The method of claim 26, wherein the step of adjusting internal resistances satisfies R={square root over ZaZb)} where R is the internal resistance, $Z_a$ is the complex impedance of the first resonator, and $Z_b$ is the complex impedance of the second resonator.

28. The method of claim 26, wherein the step of adjusting said first and second resistances includes applying a bias voltage to the amplifier.

29. The method of claim 26, wherein the step of adjusting internal resistances includes passing the differential output signal through at least one resistor connected in series with at least one of the first and second resonators.

30. The method of claim 26, wherein the step of adjusting internal resistances includes passing the differential output signal through at least one resistor connected in parallel with at least one of the first and second resonators.

31. The method of claim 29, wherein the at east one resistor is a variable resistor.

32. The method of claim 30, wherein the at least one resistor is a variable resistor.

33. The method of claim 24, further comprising the step of passing the differential output signal through at least one capacitor connected in parallel with at least one of the first and second resonators.

34. The method of claim 24, further comprising the step of passing the differential output signal through at least one capacitor connected in series with at least one of the first and second resonators.

35. The method of claim 24, further comprising the step of passing the differential output signal through at least one inductor connected in parallel with at least one of the first and second resonators.

36. The method of claim 24, further comprising the step of passing the differential output signal through at least one inductor connected in series with at least one of the first and second resonators.

37. The method of claim 24, further comprising the step of passing the differential output signal through at least one additional resonator connected in parallel with at least one of the first and second resonators.

38. The method of claim 24, further comprising the step of passing the differential output signal through at least one additional resonator connected in series with at least one of the first and second resonators.

39. The method of claim 24, further comprising the step of passing the differential output signal through a first resistance at the positive output port of the amplifier and passing the differential output signal through a second resistance at the negative output port of the amplifier, the second resistance differing from the first resistance to create transmission zeros in a filter transfer function.

40. The method of claim 24, further comprising the of generating the differential output signal from a positive output port having a first resistance and generating the differential output signal from a negative output port having a second resistance differing from the first resistance to create transmission zeros in a filter transfer function.

41. The method of claim 39, further comprising adjusting resistance values of the two differing resistances to adjust values of the transmission zeros in the filter transfer function.

42. The method of claim 40, further comprising adjusting resistance values of the two differing resistances to adjust values of the transmission zeros in the filter transfer function.

* * * * *